United States Patent [19]

Steigerwald et al.

[11] 4,358,657
[45] Nov. 9, 1982

[54] SEALING SYSTEM FOR A MOVABLE VACUUM CHAMBER OF A CHARGED PARTICLE BEAM MACHINE

[75] Inventors: Karl-Heinz Steigerwald, Starnberg; Peter Anderl; Erwin Kappelsberger, both of Munich; Clauspeter Mönch, Grafrath; Dieter König, Munich; Wilheim Scheffels, Puchheim, all of Fed. Rep. of Germany

[73] Assignee: Messer Griesheim GmbH, Fed. Rep. of Germany

[21] Appl. No.: 196,396

[22] Filed: Oct. 14, 1980

Related U.S. Application Data

[63] Continuation of Ser. No. 909,697, May 25, 1978, abandoned.

[30] Foreign Application Priority Data

May 27, 1977 [GB] United Kingdom ............... 22620/77

[51] Int. Cl.³ ............................................. B23K 15/00
[52] U.S. Cl. ...................... 219/121 EN; 219/121 EL; 219/121 EX
[58] Field of Search .................. 219/121 EN, 121 EL, 219/121 EX

[56] References Cited

U.S. PATENT DOCUMENTS

| | | | |
|---|---|---|---|
| 2,590,084 | 3/1952 | Bernard | 219/72 X |
| 3,136,882 | 6/1964 | Radtke | 219/121 EB |
| 3,219,792 | 11/1965 | Pederson | 219/121 EN |
| 3,291,349 | 12/1966 | McKellar et al. | 226/200 |
| 3,435,185 | 3/1969 | Gerard | 219/121 EN X |
| 3,719,791 | 3/1973 | Peyrot | 219/121 EN |
| 3,757,076 | 9/1973 | Peyrot | 219/121 EB |
| 3,814,443 | 6/1974 | Steigerwald | 277/5 |
| 4,045,647 | 8/1977 | Thome | 219/121 EN |
| 4,072,844 | 2/1978 | Sayegh | 219/121 EB |
| 4,103,912 | 8/1978 | Thome | 219/121 EB X |

FOREIGN PATENT DOCUMENTS

| | | |
|---|---|---|
| 235996 | 9/1964 | Austria . |
| 811844 | 4/1959 | United Kingdom . |
| 1014245 | 12/1965 | United Kingdom . |
| 1086464 | 10/1967 | United Kingdom . |
| 1089839 | 11/1967 | United Kingdom . |
| 1186091 | 4/1970 | United Kingdom . |
| 1197141 | 7/1970 | United Kingdom . |
| 1238554 | 7/1971 | United Kingdom . |
| 1250378 | 10/1971 | United Kingdom . |
| 278926 | 11/1970 | U.S.S.R. ....................... 219/121 EB |

OTHER PUBLICATIONS

Sciaky "Sciaky Electron-Beam Welder for Distributor Cams", Machinery and Production Eng'g. vol. 122, No. 3152, Apr. 18, 1973, pp. 511-513.

Primary Examiner—C. L. Albritton
Attorney, Agent, or Firm—Brumbaugh, Graves, Donohue & Raymond

[57] ABSTRACT

A system for sealing the working vacuum chamber of a charged particle beam machine which is movable with respect to a workpiece is disclosed. The system includes a housing with a central compartment having wire-shaped elements urged against the workpiece to provide a seal therebetween, and lateral compartments, each having a packing of sealing material which is biased against the workpiece surface of a spring arrangement. Rollers and a flexible lip seal arrangement having a flexible sheath of synthetic rubber are also disclosed.

5 Claims, 16 Drawing Figures

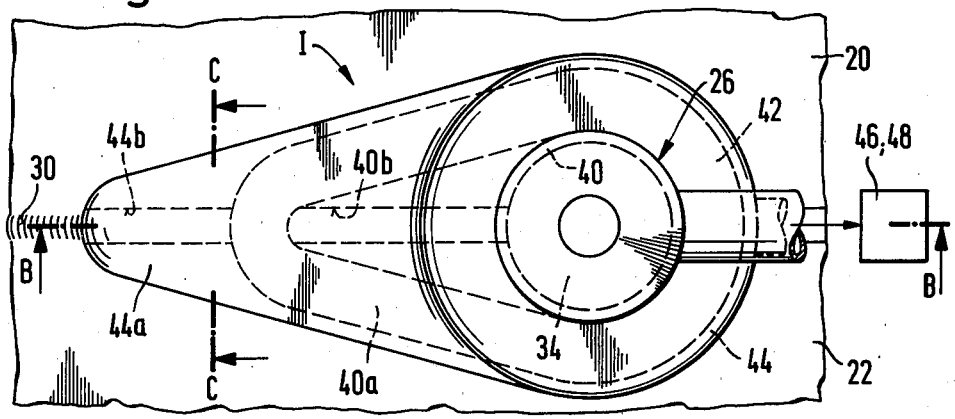
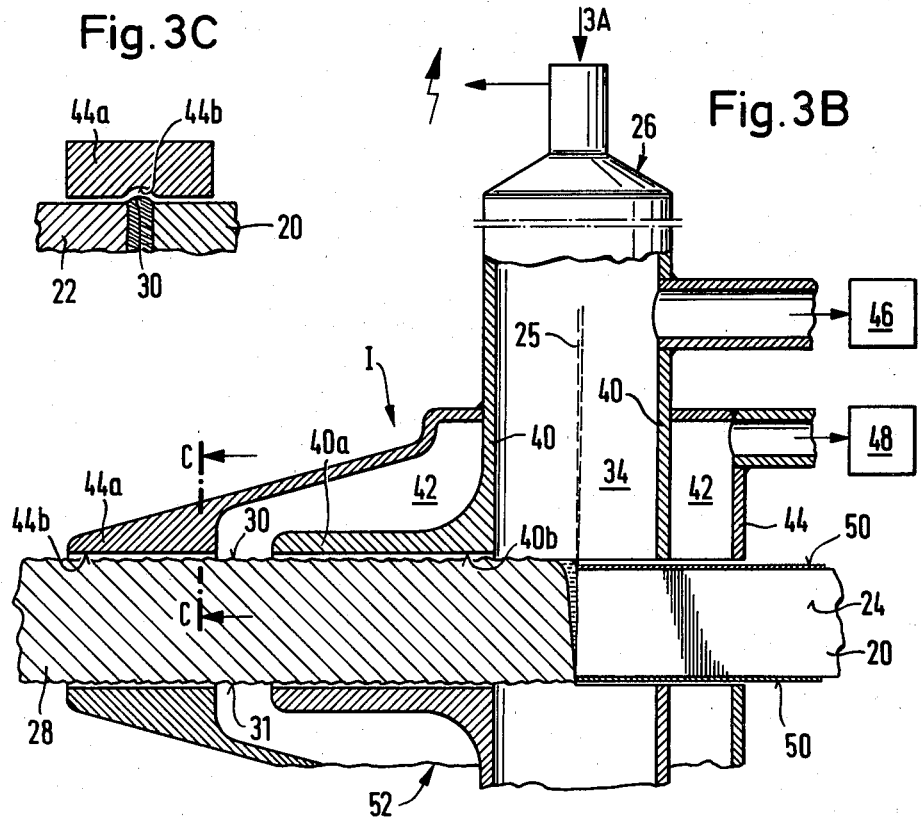

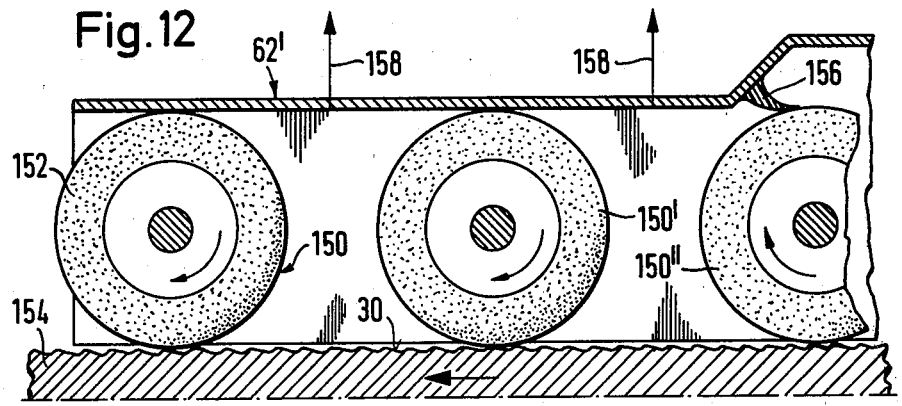
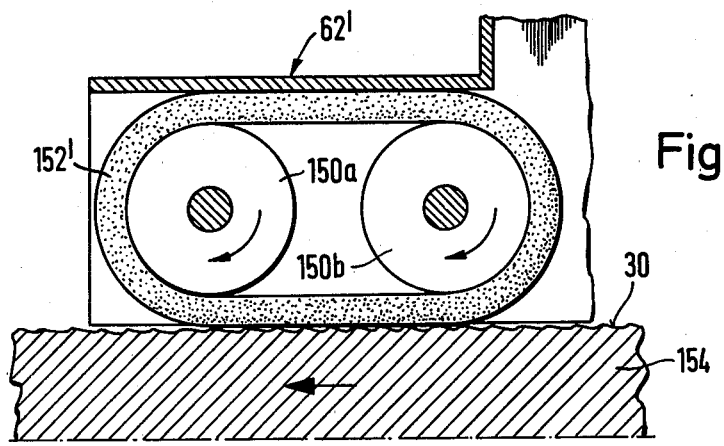
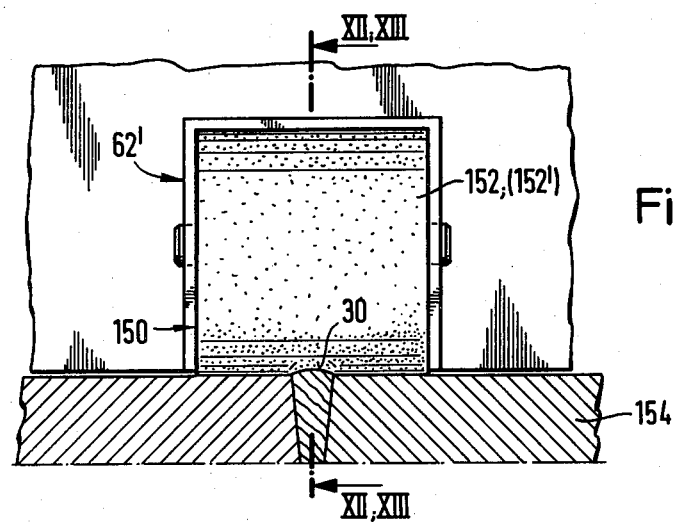

SEALING SYSTEM FOR A MOVABLE VACUUM CHAMBER OF A CHARGED PARTICLE BEAM MACHINE

This is a continuation of application Ser. No. 909,697 filed May 25, 1978, abandoned.

The invention relates to processing a workpiece with a beam of charged particles. More particularly, the invention relates to performing operations such as welding, cutting, melting, vaporizing, heating, machining or other processing steps with a beam of charged particles, as an electron beam, produced by a machine having a vacuum chamber (sometimes called "beam column") which, during operation, is evacuated and moved in respect to the material or workpiece processed.

The invention relates to the problem of sealing the vacuum chamber which is movable in respect to the workpiece. It is known from U.S. Pat. No. 3,136,882, to seal the beam exit opening of the vacuum chamber of an electron beam welding machine in respect to a workpiece by a compressible rubber sealing ring pressed against and sliding on the workpiece surface. A gap between two workpiece parts to be joined by welding and the weld seam produced by the machine is covered by an adhesive tape. A channel-shaped metal member is attached with adhesive tapes to the rear side of the workpiece to seat the gap at the beam exit side of the workpiece.

A further known approach to seal a movable vacuum chamber in respect to the workpiece is to use a pressure stage seal, i.e. to use a number of concentric zones of gradually increasing vacuum for the atmosphere to the inner vacuum chamber in which the beam gun is located.

It is further known from British Pat. No. 1,292,338; German Pat. No. 18 05 719; French Pat. No. 69 36 856 to form a flexible seal for a vacuum chamber of an electron beam (E.B.) welding machines by means of a suspension of magnetizable particles in carrier fluid such, as silicon oil. The suspension is brought in a quasi-elastic state by means of a periodically varied unindirectional magnetic field.

A problem, which is common to all known sealing systems of this type is to provide proper sealing at the region of the seal, where the workpiece zone to be processed by the beam enters the vacuum chamber and/or at the region of the seal were the zone of the workpiece which has been processed by the beam, leave the vacuum chamber. The term "processing zone" is used in the following for both the zone of the workpiece to be processed by the beam and the zone of the workpiece which has been processed by the beam, since both the zone to be processed and the zone already processed may create sealing problems. The zone to be processed often includes a gap or other structural features through which air can enter the vacuum chamber, and the processed zone, e.g. a welding bead, is generally rough and hot and may be protruding over the adjacent portions of the workpiece surface.

Thus, the main problem dealt with by this invention is the sealing of a vacuum chamber which houses a beam gun or generator and is relatively movable with respect to a workpiece, specifically to provide an appropriate sealing in respect to the processing zone of the workpiece.

A further object of the invention is to provide a sealing system which affords proper sealing between a vacuum chamber in respect to a rough, hot, uneven or other surface difficult to seal by means of the known sealing systems.

This problem is solved according to a first important aspect of the present invention by using a sealing zone, which has an enlarged radial seal width at at least one of said processing zone entrance section or processing zone exit section. Further, the sealing zone preferably comprises a device for pressing sealing means against the workpiece surface, said device covering a length direction of said processing zone which length being greater than the normal width of said sealing zone.

Thus, the edge of said vacuum chamber or the wall dividing two pressure stages in the direction of a relative movement with respect to workpiece may be extended, so that the restricted flow passage for the air is made longer, which always exits to a greater or lesser extent across the sealing zone.

A further important aspect of the invention is to provide a special sealing section with a box-shaped casing which forms in fact some sort of extension of the sealing zone and which comprises some kind of package or other means which is able to conform to an uneven surface of the workpiece and to proved the necessary sealing.

The casing may comprise a bush-like bundle of metal wires, e.g. brass wires, which are pressed with their one end against the workpiece surface by a spring or similar device while on each side of the brush-like packing of wires preferably two pads of a deformable or pliable material are provided, e.g. a fabric of felt or fleece of mineral fibers, as abestos or glass or ceramic fibers.

Another approach is to fit one or a number of subsequent rollers rotably mounted in the casing. The axial ends of each roller abut tightly against the sidewalls of the casing, its lower portion bears in a sealing relationship on the surface of the workpiece, and the periphery of the roller, e.g. on the opposite side of the workpiece, slides tightly and sealingly on the casing or some other sealing element.

A chainlike or tracklike device (i.e. a track used in a heavy tractor) may be used instead of the rollers just mentioned.

Still another approach would be a bead of particular or granular or powder material instead of the brass wire packing, said bead being replenished at the inner end and, if desirable, taken off at the outer end and if desired, recycled the bead may consist of steel granules or sand.

A thermoplastic material may be used to smooth the surface and to alleviate the sealing.

Another approach is to apply a material which forms a continuous, elastic or pliable body, or can be brought in the form of such a body upon application, to the processing zone before it passes through the seal, so that it conforms to the rough surface or surface features and forms and intermediate layer having a relatively smooth surface which can be easily sealed by a conventional sealing system, as a lip seal. This material forms in fact also an extended seal. The material is pressed firmly against the rough or uneven or slotted surface to be sealed and conforms to the surface features because of its pliability, softness or elasticity. It conforms smoothly and tightly to the sliding or rolling seal of the mobile vacuum chamber. The intermediate material can be taken off from the workpiece surface at an area, where it has been released by the sealing system, i.e. where the seal has slid or rolled over the material.

In a specific embodiment, the material is then collected and recycled through a vacuum lock to that side of the moving seal, at which the material is applied. The vacuum lock may be a simple hole in a wall of the vacuum chamber which is sealed by the material pressed through.

The material may be e.g. a band, strip or cord of very soft rubber with a central or inner textile band for reinforcement. Alternatively, the material may be applied in the state of a powder, liquid or dough to the surface to be sealed and then by change of temperature transformed to a continuous, solid and elastic state so that it can be easily removed (stripped) from the workpiece behind the seal. The material may comprise a high proportion of a material of high atomic number, as lead, to provide for the necessary X-ray sealing. This is a desirable but no necessary feature, and other materials can be used, e.g. a band or cord of asbestos, fibers, if the X-ray sealing is provided by other means.

The problem of preventing X-ray from escaping from the inner of the vacuum chamber through the seal to the outside should be taken care of in any sealing system used with a charged particle beam machine.

A further important embodiment of the invention comprises a combination of a pressure stage seal with a lip seal arrangement, e.g. a system wherein the edge of one or each pressure stage of a pressure stage seal is provided with a flexible lip seal member to enhance the sealing and to reduce the leakage.

Further objects, features and advantages of the invention will be come apparent when reading the following description of specific, non-limiting embodiments.

In the drawings

FIG. 1 a highly schematical section view in elevation of a portion of an electron beam welding machine and a workpiece welded;

FIG. 3A is a bottom view of a pressure stage scaling system according to an embodiment of the invention;

FIG. 3B is a section view along a line B—B in FIG. 3A;

FIG. 3C is a section view along a line C—C in FIG. 3A;

FIG. 12 is a section view of a modification of the sealing system shown in FIGS. 4 and 5;

FIG. 13 is a partial view of another modification of the sealing system shown in FIGS. 4 and 5; and FIG. 14 is a front end view of the sealing systems of FIGS. 12 and 13.

Figure 1:
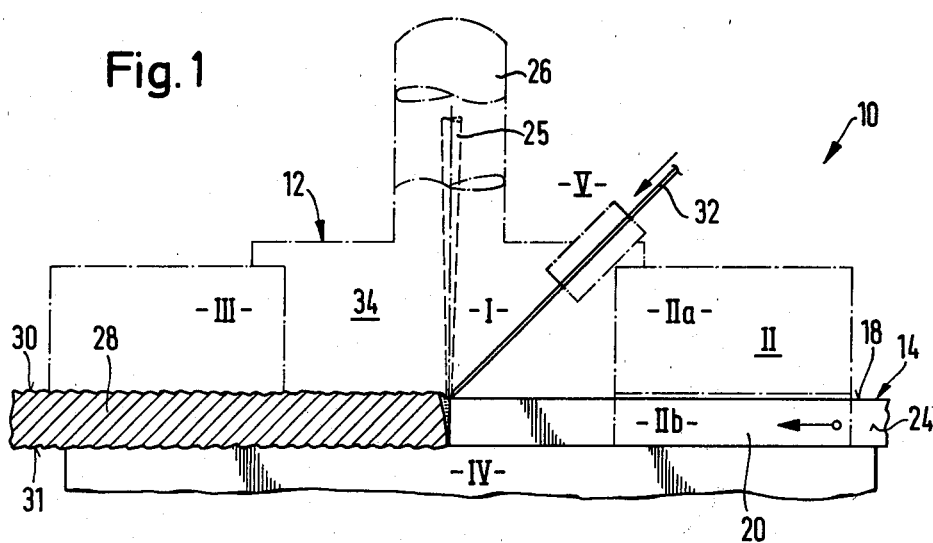
Figure 2:
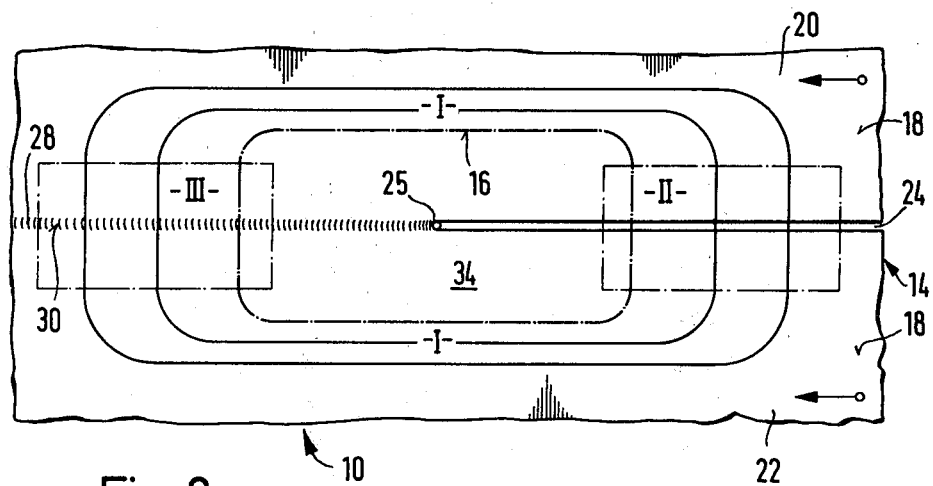
FIG. 2 is a schematic plan view of the sealing system of the machine of FIG. 1.

FIG. 1 shows in a highly schematic manner an electron beam (E.B.) welding machine 10 having a vacuum chamber 12 which is movable in respect to a workpiece 14. The vacuum chamber 12 has a beam exit opening 16(FIG. 2) which is sealed against a surface 18 of the workpiece in a manner to allow the relative movement between the E.B. welding machine in the workpiece. The workpiece shown consists of two plates 20, 22 which form a gap 24 ("processing zone") where the plates 20, 22 are to be joined by an electron beam 25 produced by a beam gun (not shown) located in a column section 26 of the vacuum chamber. The beam, which may be oscillated in a direction transverse to the gap 24 fuses the workpiece material and forms a weld seam 28 which generally has an upper and lower weld beam 30 and 32, respectively, which, generally protrude somewhat above the essentially flat surface of the plates 20, 22 and have a rough and irregular surface.

A filler or additional material in form of a wire or rod 32 may be supplied to the pool of molten material which is formed at the welding site by the beam 25.

It is well known, that a fairly high vacuum must be maintained in an inner portion 34 of the vacuum chamber in which the E.B. gun is housed as the beam 25 propagates. The sealing system which is necessary for maintaining this vacuum can be divided in several zones, which are marked with roman numerals in FIGS. 1 and 2, namely:

I. A lateral section of the sealing system which provides for sealing the beam exit opening 16 against the opposed workpiece surface;

II. A section through which a workpiece zone, which is to be processed by the beam enters the vacuum chamber ("processing zone entrace section");

III. A zone through which the zone which has been processed by the beam, leaves the vacuum chamber ("processing zone exit section");

IV. A rear portion of the sealing system which provides for sealing the beam exit side of the workpiece; and V. A lock section, if needed, for supplying the rod-shaped or wire-shaped additional material 32 to the welding side.

The problem underlying the invention has been just described with reference to electron beam welding, however, similar problems exist when other processing operations are to be formed by an electron beam or ion beam machine having a mobile vacuum chamber which moves with respect to the workpiece. Such operations are e.g. cutting, melting, vaporizing, heating, machining, engraving (e.g. printing cylinder). The invention is likewise applicable to such other operations, however, it will be described with reference to E.B. welding since this is one of the most common E.B. processing operations.

The lateral sealing sections I and II pose the least problems, since the workpiece surface will be generally smooth in this area. An elastic sealing element as shown in U.S. Pat. No. 3,136,882 or a pressure stage seal will generally do the job, however, an improved sealing arrangement for this section will be described later.

It is generally more difficult to provide for proper sealing in section II since the processing zone which enters the vacuum chamber through this section may comprise a gap, as the gap 24 formed by the opposed front edges of the plates 20 and 22 which makes sealing more difficult.

In section III it is still more difficult to provide for the proper sealing because of the irregular surface features of the welding beads.

Since an essential portion of the beam 25 emerges from the beam exit side of the workpiece, the rear side sealing section IV must be constructed so that it is not damaged by the beam.

The lock for the filler material 32 at sealing section V may be provided by an elastic sealing element or a pressure stage seal, preferably, however, by a combination of both.

One of several measures which, according to the invention, can be taken individually or in combination is to broaden or extend the width of the seal in the processing zone exit region and/or the processing zone entrance region. Thus, for example the edge of the vacuum chamber of the wall dividing two pressure stages is broadened or extended in the direction of relative movement with respect to the processing zone of the workpiece so that the restricted flow passage for the air is made longer.

FIGS. 3A and 3B show a vacuum chamber having a sealing system with two pressure stages and a processing zone exit region II designed according the concept just described. The pressure stage sealing system comprises an inner wall 40 forming a seal separating the inner vacuum chamber 34 from an annular intermediate vacuum chamber 42 having an outer wall 44 forming a seal separating the intermediate vacuum chamber 42 from the surrounding atmosphere. At the processing zone exit side, where the upper weld bead 30 leaves the vacuum chamber, the wall 40 comprises a portion 40a of enlarged width. The wall 44 comprises a similar portion 44a, the width of which being extended in the direction of relative movement with respect to the welding bead 30. The front end of the enlarged wall sections 40a, 44a which is shown in FIG. 3A, may form a channel-shaped slot 40b, 44b (FIG. 3C) to accommodate the front end to the protruding upper weld bead 30.

The inner chamber 34 and the intermediate chamber 42 are connected to appropriate vacuum pump systems 46, 48 respectively, as known in the art.

To provide a proper seal at the processing zone entrance section, the gap 24 may be sealed with two tapes 50 made of metal foil and secured with an adhesive to the workpiece. A sealing system 52 similar to that just described may be provided at the beam exit side of the workpiece. A preferred alternative of a sealing system for the rear of the processing zone, which is welded by the beam, will be described below with reference to FIG. 8.

Figure 4:
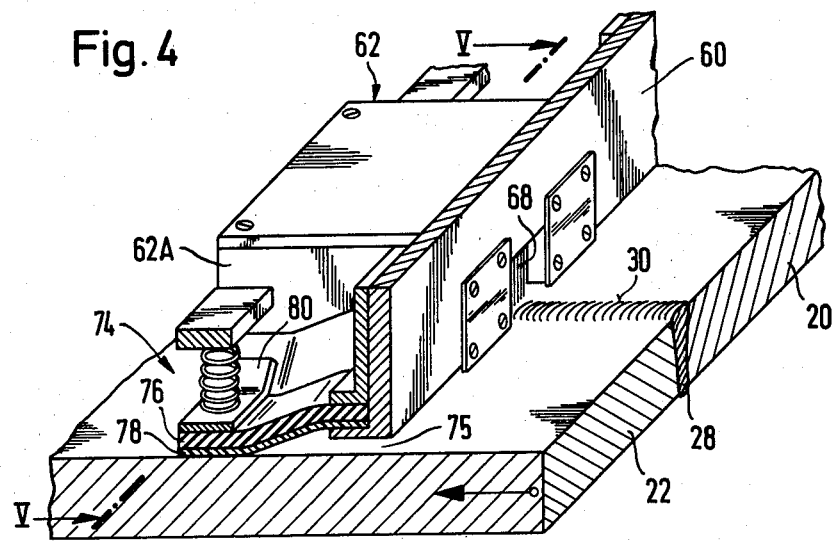
FIG. 4 is a partial perspective view of a portion of a sealing system according to an embodiment of the invention.
Figure 5:
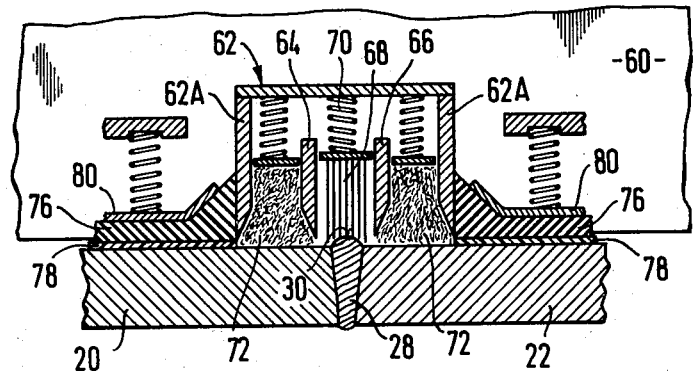
FIG. 5 is a cross-section view in a plane V—V of FIG. 4.

FIGS. 4 and 5 show another embodiment of the processing zone exit section of a sealing system according to the invention. As shown, a wall 60 of a vacuum chamber is provided with a box-shaped extension 62 which forms an exit section seal for the weld beam 30. The wall 60 with the box-shaped extension 62 may replace extended wall portions 40a and/or 44a of the embodiment of FIG. 3, or may be the sole wall separating the vacuum chamber 34 from the surrounding atmosphere.

The box-shaped extension 62 comprises two intermediate walls 64, 66 which divide the space within the box 62 into a center compartment and two lateral compartments. The center compartment comprises a brush-like bundle of metal wires 68 which are pressed with their one end against the weld bead by a spring 70. The lateral compartments each comprise a pad 72 of a deformable or pliable material, e.g. a fabric or felt or fleece of mineral fibers, as asbestos or glass fibers.

The lower end portions of side walls 62A of the box-shaped extension 62 and of the intermediate walls 64, 66 may be tapered away from the pads 72 as shown in FIG. 5 to allow some spreading of the pads 72 at the surface of the workpiece.

On both sides of the box-shaped extension 62, the wall 60 is preferably provided with a lip seal arrangement 74 which considerably reduces the leakage through the narrow gap 76 which is present in all conventional pressure stage sealing systems. The sealing arrangement 74 comprises an elongated, strip-shaped sheet member 76 of elastic material, preferably synthetic rubber, and a film 78 of a low friction material, e.g. of polytetrafluorethylene or a similar polymeric material. The lip seal 76-78 is pressed against the surface of the workpiece by a spring-loaded metal ledge 80. The rubber sheet 76 may comprise an end portion of increased thickness adjacent to the box-shaped extension 62 as shown.

Figure 6:
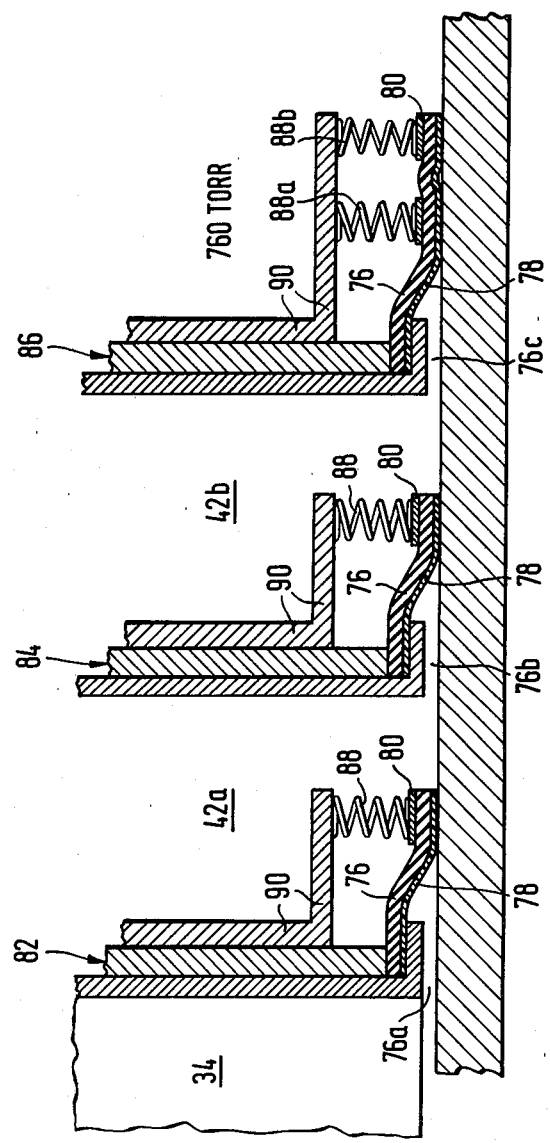
FIG. 6 is a section view of a preferred embodiment of a portion of a pressure stage sealing system.

FIG. 6 shows a preferred embodiment of a sealing system, which is a combination of a pressure stage seal and a lip seal arrangement, and which is preferably used for sealing the vacuum chamber in the lateral sections I (FIG. 2) and the portions of sealing sections II and III adjacent the processing zone sealing sections. The pressure stage seal shown in FIG. 6 comprises three walls 82, 84, 86 (similar to the sealing system shown in FIG. 2) which form an inner vacuum chamber 34 and two intermediate vacuum chambers 42a, and 42b. The lower edges of the walls 82, 84 and 86 and shortly before the surface of the workpiece forming small gaps 76a, 76b and 76c respectively. To reduce the leakage through each of these gaps, an additional lip seal arrangement is provided to seal each of these gaps, the lip seal arrangements being similar to the sealing arrangement 74 just described. Thus, each lip seal arrangement comprises a flexible sheet 76 make preferably of synthetic soft rubber and having a thickness of, say, 5 mm, and a film 78 of a low-friction material, as polytetrafluoroethylene. The strip-shaped structure formed by the sheet 76 and the film 78 is mounted, e.g. clamped, in an air-tight manner to the respective wall while the other end portion is pressed by a series of springs 88 against the workpiece; the springs being mounted between one leg of an L-shaped ledge 90 having its other leg attached to the respective wall, and a ledge 80 bearing against the rubber sheet.

The lip seal arrangement may be still further enlarged by providing two spaced rows of springs 88a, 88b as shown in combination with wall 86 abutting the outer atmosphere; however, also the other walls may be provided with such an enlarged lip seal arrangement.

The lip seal arrangements just described as reference to FIG. 6 can also be used in a sealing system having a single wall only which separates a high vacuum chamber from the outer atmosphere.

Figure 7:
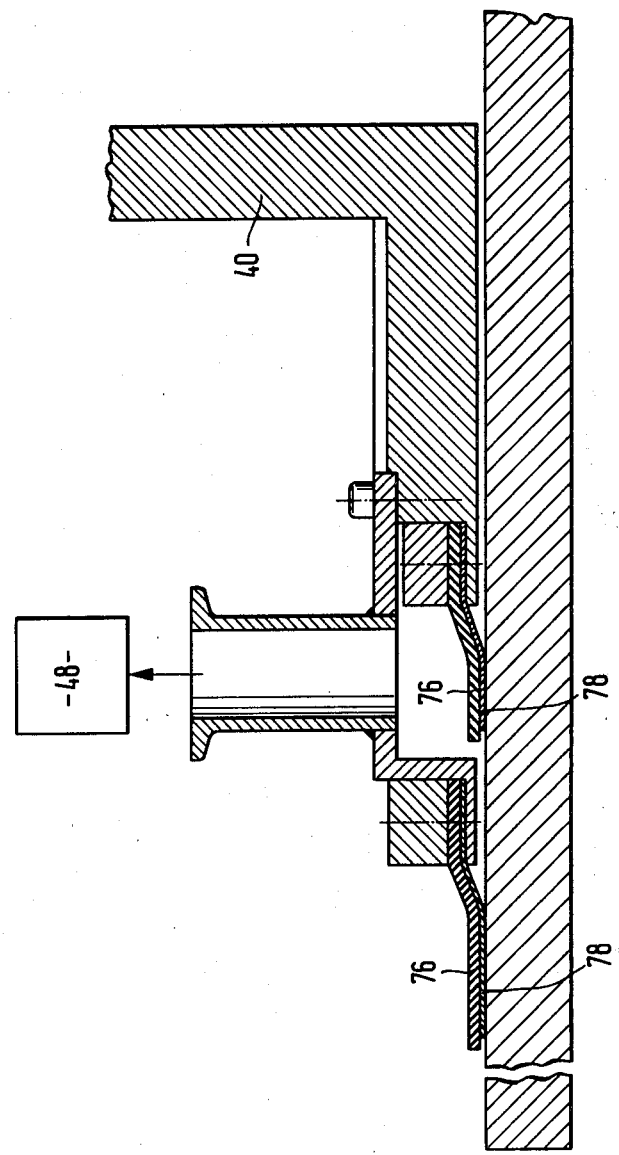
FIG. 7 is a section view of another embodiment of a pressure stage sealing system with additional elastic lip sealing elements.

FIG. 7 shows a more simple combination of a pressure stage sealing system with a lip seal arrangement. The sealing system of FIG. 7 corresponds essentially to that described as reference to FIG. 6 with the exception that the spring means is omitted, which presses the sealing lip consisting of the rubber sheet 76 and the anti-friction film 78 against the workpiece surface. In this case, the film 78 preferably ends at some distance before the free end of the rubber sheet or the film 78 is firmly attached to the sheet 76.

Figure 8:
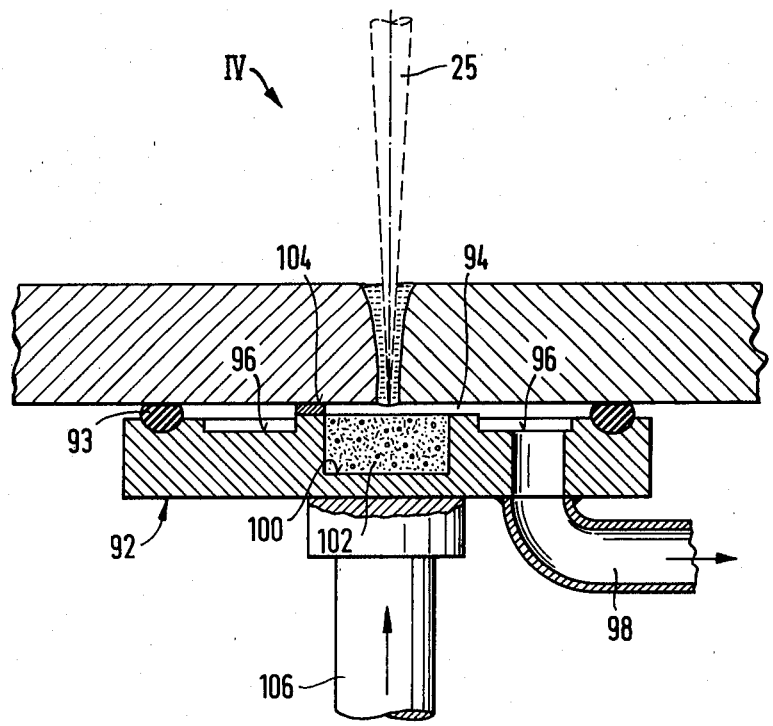
FIG. 8 is a section view of a sealing system for the beam exit side of a workpiece welded by an electron beam.

FIG. 8 shows a preferred embodiment of the sealing section IV sealing the rear or beam exit side of the workpiece. The sealing section shown in FIG. 8 comprises a channel-shaped member 92 forming a chamber 94 at the rear side of the processing zone of the workpiece. An elastic seal 93 seals the chamber 94 against the outer atmosphere. The chamber comprises two lateral portions 96 communicating with an exhaust tube 98 and a central section 100 of increased depth which comprises a particulate material 102 which may be a metal powder or metal granulate and has the purpose of dissipating the emerging portion of the electron beam 25 and/or preventing the molten material from flowing out of the welding side. The material 102 may be e.g. relatively coarse metal powder or metal granulate, or sand. The body 92 is pressed by a plunger 106 against the rear side of the workpiece, and spacers 104 may be provided at spaced locations along the length of the body 92 to prevent the body from bending.

Figure 10:
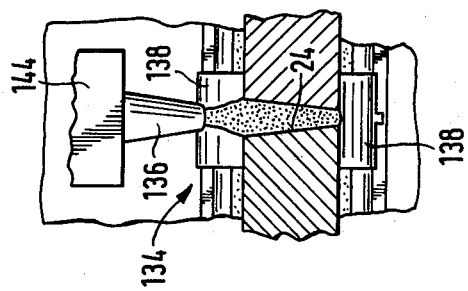
FIG. 10 is a section view in a plane X—X of FIG. 9.
Figure 9:
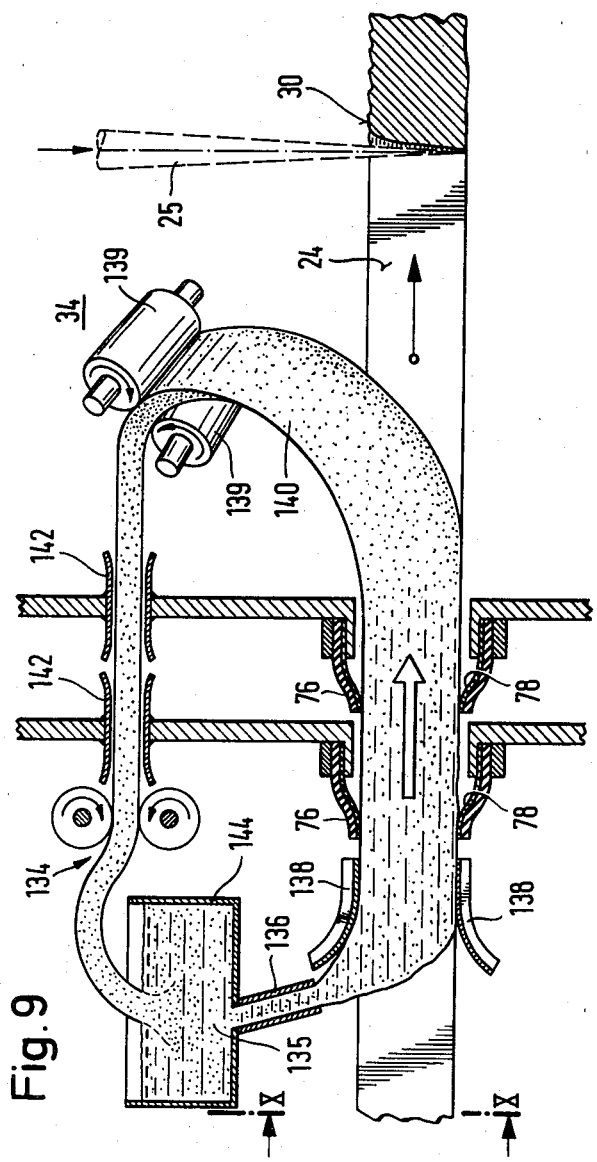
FIG. 9 is a schematic view, partially in section, of a processing zone entrance section of a sealing system according to a futher embodiment of the invention.
Figure 11:
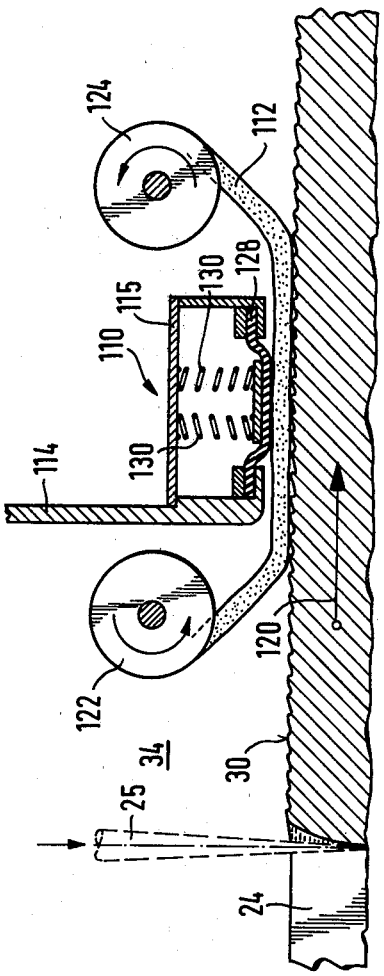
FIG. 11 is a simplified section view of the processing zone exit section of a sealing system of the type shown in FIGS. 9 and 10.

The sealing system shown in FIGS. 9 to 11 makes use of a material which forms a continuous, elastic or pliable body, or can be brought in the form of such a body upon application to the workpiece, to conform to the surface features of the workpiece and form a seal with a relatively smooth surface which can be easily sealed by a pressure stage seal and/or a lipseal.

FIGS. 9 and 10 show an embodiment of such a sealing system useful for the processing zone entrance side of the sealing system of a E.B. welding machine. The sealing system is adapted to seal a relatively wide and irregular gap 24 between opposed surfaces of two workpiece portions to be joined by E.B. welding. The sealing system 134 of FIG. 9 comprises a two-stage sealing arrangement of the type described with reference to FIGS. 6 or 7 on both sides of the workpiece. To provide for sealing the gap 24, a sealing material, e.g. a preheated thermoplastic polymeric material, is introduced (poured or injected) in a liquid or plastic state into the gap 24 and smoothed at the upper and lower side by smoothing plates or shoes 138 (or rollers). The material is chosen such that it attains a highly viscous or solid elastic state within the gap by cooling and/or polymerizing, the state being such that the material can be removed in the form of a continuous body or band 140 from the gap after having passed the sealing zone 134. The material may be removed from the gap by an appropriately driven take-up reel, as described below with reference to FIG. 11, or ba a pair of rollers 139 in which case it may be recycled through a lock system 142 to the atmosphere, where it is again liquified by application of heat in a supply container 144, so that it can be applied again through a nozzle 136.

The material may comprise elongated flexible fibers e.g. polyester or glass fibers, or similar reinforcement materials to enhance the tear strength and the continuity of the applied material so that the band 140 does not rupture during removal from gap 24. The workpieces form preferably a wedge-shaped gap 24 as shown in FIG. 10.

FIG. 11 shows an embodiment of a processing zone exit section of the sealing system of an E.B. welding machine comprising a vacuum chamber with a wall 114. A cord or band 112 of glass or mineral fibers, as asbestos, is used to smoothen the rough surface portion comprising the weld bead 30 of the weld seam. The workpiece with the weld bead 30 moves in the direction of of an arrow 120 in respect to the wall 114. The band 112 is delivered from a supply reel 122 rotably supported by means not shown within the vacuum chamber 34 and passes below a sealing system 110 which includes a box-shaped extension 115 of the wall 114. The bottom side of the box-shaped extension 115 is formed by a flexible sheet 128 of a low-friction material, as polytetrafluorethylene which is pressed by springs 130 against the band 112 and the workpiece surface. The band 112 smoothes the uneven surface features, so that the flexible film or sheet 128 can provide a seal with low leakage rate. The band 112, after having passed through the sealing system, is taken up by a take-up reel 124. The band 112 may be impregnated with a liquid or greasy substance of low vapor pressure, as a heat-resistant silicone compound, to enhance the sealing properties.

The band 112 may be recirculated as shown in FIG. 9.

FIG. 12 shows a further alternative of a sealing system which is preferably used in the processing zone exit section. The overall system may be similar to that shown in FIGS. 4 and 5 with the exception that the wire bundle 68 in the middle compartment of the box-shaped extension is replaced by one or several rollers 150 having a surface layer 152 of a pliable or resilient material, as a metal felt. The rollers bear sealingly against the surface of the workpiece 154 which may include a weld bead 30 which is accommodated by the resilient layer 152. The axial ends of each roller abut tightly against the side walls of the box 62' and the periphery of the roller on the opposite side of the workpiece slides tightly and sealingly on the inner side of a top wall of the box or other sealing element, e.g. a lip seal 156. If a number of subsequent rollers 150, 150', 150'' are used, exhaust tubulations schematically shown by arrows 158 may be connected to the space between two subsequent rollers to provide some kind of pressure stage seal.

The embodiment of FIG. 13 differs from that shown in FIG. 12 mainly in that two rollers 150a, 150b supporting an endless loop 152' of an elastic appliable material are used instead of a roller 150. The loop 152' may be comprised of a metal fiber felt or a fabric of asbestos or mineral fibers, preferably impregnated with a low vapor pressure liquid or grease as a silicon compound. The pair of rollers 150a, 150b with the tracklike endless loop or band 152' operated similar to a roller 150, 152 of FIG. 12. The system of FIG. 13 provides, however, a leakage path of increased length as compared with the roller 150. Of course, a number of pairs of rollers may be used in succession.

Preferred embodiments of the invention have been shown and disclosed, it is, however, to be understood that the invention has been described by way of illustration rather than limitation.

We claim:

1. A sealing system for a vacuum chamber of a machine arranged to mount on a workpiece for processing said workpiece with a beam of charge particles produced by a beam gun mounted relative to said chamber so that the beam is within said vacuum chamber, said vacuum chamber being arranged to mount to said workpiece in a manner to allow relative movement with respect to the workpiece and having a beam exit opening surrounded by a circumferential seal formed by an annular end portion of said vacuum chamber and arranged to cooperate with an opposed surface of said workpiece, said seal and said chamber moveable along said workpiece surface, said seal having a radial sealing width between said beam exit opening and the surrounding environment, for sealing said beam exit opening against said surface such that said relative movement of said chamber and said seal with respect to said workpiece can take place while securing a path of high flow resistance across said seal from said surrounding environment to said vacuum chamber, said workpiece being processed while moving relative to said vacuum chamber, wherein said seal includes an entrance section through which a portion or said workpiece to be processed enters said chamber radially with respect to said seal for processing by said beam and an exit section through which a processed workpiece portion, which has a hot and relatively uneven surface compared to the unprocessed portion of said workpiece, leaves said chamber radially with respect to said seal characterized in that for improving the flow resistance of said seal, said seal has a greater radial width in the region of at least one of said entrance or exit sections of said seal than at other circumferential points, and wherein said wider part of said seal includes a housing comprising a packing of wire-shaped elements having free ends and means for pressing said free ends of said wire-shaped elements against said workpiece surface.

2. A sealing system for a vacuum chamber of a machine arranged to mount on a workpiece for processing said workpiece with a beam of charged particles produced by a beam gun mounted relative to said chamber so that the beam is within said vacuum chamber, said vacuum chamber being arranged to mount to said workpiece in a manner to allow relative movement with respect to the workpiece and having a beam exit opening surrounded by a circumferential seal formed by an annular end portion of said vacuum chamber and arranged to cooperate with an opposed surface of said workpiece, said seal and said chamber moveable along said workpiece surface, said seal having a radial sealing width between said beam exit opening and the surrounding environment, for sealing said beam exit opening against said surface such that said relative movement of said chamber and said seal with respect to said workpiece can take place while securing a path of high flow resistance across said seal from said surrounding environment to said vacuum chamber, said workpiece being processed while moving relative to said vacuum chamber, wherein said seal includes an entrance section through which a portion of said workpiece to be processed enters said chamber radially with respect to said seal for processing by said beam and an exit section through which a processed workpiece portion, which has a hot and relatively uneven surface compared to the unprocessed portion of said workpiece, leaves said chamber radially with respect to said seal characterized in that for improving the flow resistance of said seal, said seal has a greater radial width in the region of at least one of said entrance or exit sections of said seal than at other circumferential points, wherein said one of said sections comprises a generally box-shaped extension member having at least one roller rotatably mounted therein, said roller sealingly abutting against said workpiece surface and being sealed against the inner walls of said box-shaped extension member.

3. A sealing system for a vacuum chamber of a machine arranged to mount on a workpiece for processing said workpiece with a beam of charged particles produced by a beam gun mounted relative to said chamber so that the beam is within said vacuum chamber, said vacuum chamber being arranged to mount to said workpiece in a manner to allow relative movement with respect to the workpiece and having a beam exit opening surrounded by a circumferential seal formed by an annular end portion of said vacuum chamber and arranged to cooperate with an opposed surface of said workpiece, said seal and said chamber moveable along said workpiece surface, said seal having a radial sealing width between said beam exit opening and the surrounding environment, for sealing said beam exit opening against said surface such that said relative movement of said chamber and said seal with respect to said workpiece can take place while securing a path of high flow resistance across said seal from said surrounding environment to said vacuum chamber, said workpiece being processed while moving relative to said vacuum chamber, wherein said seal includes an entrance section through which a portion of said workpiece to be processed enters said chamber radially with respect to said seal for processing by said beam and an exit section through which a processed workpiece portion, which has a hot relatively uneven surface compared to the unprocessed portion of said workpiece, leaves said chamber radially with respect to said seal characterized in that for improving the flow resistance of said seal, said seal has a greater radial width in the region of at least one of said entrance or exit sections of said seal than at other circumferential points, wherein said one of said sections comprises a generally box-shaped extension member having at least one pair of rollers rotatably mounted therein, said pair of rollers supporting an endless band of generally resilient material which sealingly bears against said workpiece surface and being sealed against the inner walls of said box-shaped extension member.

4. The system as claimed in claim 1 wherein said housing has a central compartment, in which said wire-shaped elements are located, and two lateral compartments on both sides of said central compartment, and wherein each of said compartments comprises a packing of a sealing material and means for pressing said packing against the workpiece surface.

5. A sealing system for a vacuum chamber of a machine arranged to mount on a workpiece for processing said workpiece with a beam of charged particles produced by a beam gun mounted within said vacuum chamber, said vacuum chamber being arranged to mount to said workpiece in a manner to allow relative movement with respect to the workpiece and having a beam exit opening surrounded by a circumferential seal formed by an annular end portion of said vacuum chamber and arranged to cooperate with an opposed surface of said workpiece, said seal and said chamber moveable along said workpiece surface, said seal having a radial sealing width between said beam exit opening and the surrounding environment, for sealing said beam exit opening against said surface such that said relative movement of said chamber and said seal with respect to said workpiece can take place while securing a path of high flow resistance across said seal from said surrounding environment to said vacuum chamber, said workpiece being processed while moving relative to said vacuum chamber, wherein said seal includes an entrance section through which a portion of said workpiece to be processed enters said chamber radially with respect to said seal for processing by said beam and an exit section through which a processed workpiece portion, which has a hot and relatively uneven surface compared to the unprocessed portion of said workpiece, leaves said chamber radially with respect to said seal characterized in that for improving the flow resistance of said seal, said seal has a greater radial width in the region of at least one of said entrance or exit sections of said seal than at other circumferential points, wherein the portion of said seal adjacent to said one of said sections comprises a lip seal having a generally flexible sheet member and means for resiliently pressing said flexible sheet member against said workpiece surface, and wherein a generally low-friction film material is provided between said sheet member and said workpiece surface.

* * * * *